| (12) | United States Patent | (10) Patent No.: | US 8,710,903 B2 |
|---|---|---|---|
| | Oraw et al. | (45) Date of Patent: | Apr. 29, 2014 |

(54) DRIVE AND STARTUP FOR A SWITCHED CAPACITOR DIVIDER

(75) Inventors: Bradley Oraw, Mesa, AZ (US); Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1146 days.

(21) Appl. No.: 12/217,078

(22) Filed: Jun. 30, 2008

(65) Prior Publication Data

US 2009/0322384 A1 Dec. 31, 2009

(51) Int. Cl.
*G11C 5/14* (2006.01)

(52) U.S. Cl.
CPC ..................................... *G11C 5/147* (2013.01)
USPC ......................................... 327/530; 327/337

(58) Field of Classification Search
USPC ............. 327/91, 94, 108–112, 170, 337, 389, 327/391, 554; 323/901, 908; 326/82, 83, 326/22–27; 363/55, 56.03, 56.04; 365/230.06
See application file for complete search history.

(56) References Cited

U.S. PATENT DOCUMENTS

| 4,793,353 | A | * | 12/1988 | Borkan ........................... 607/60 |
| 6,215,329 | B1 | * | 4/2001 | Campardo et al. .............. 326/88 |
| 7,071,765 | B2 | * | 7/2006 | Kamijo ......................... 327/536 |
| 7,405,911 | B2 | * | 7/2008 | Fuchs ............................. 361/18 |
| 7,450,361 | B2 | * | 11/2008 | Ito et al. ....................... 361/93.1 |
| 2006/0098523 | A1 | * | 5/2006 | Takita et al. ............. 365/230.06 |

* cited by examiner

*Primary Examiner* — Sibin Chen (74) *Attorney, Agent, or Firm* — Blakely, Sokoloff, Taylor & Zafman LLP

(57) ABSTRACT

Drive and startup circuits are described particularly suitable for use with a switched capacitor divider. In one example, a drive circuit has a level shifter coupled to a gate of each switch of a switched capacitor drive circuit to couple alternating current into the respective gate, a positive phase low side driver coupled to each level shifter to drive the gates of the top switch path through the respective level shifters, and a negative phase low side driver coupled to each level shifter to drive gates of the bottom switch path through the respective level shifters. A startup circuit, such as a capacitive soft start circuit may be used to slow the application of the current to each switch.

20 Claims, 10 Drawing Sheets

DRIVE AND STARTUP FOR A SWITCHED CAPACITOR DIVIDER

BACKGROUND

1. Field

The invention is in the field of semiconductor devices, more specifically pertaining to start up circuits for switched capacitor networks that are used in semiconductor device power delivery.

2. Related Art

Presently, power delivery to most integrated circuits (ICs), such as processors, graphic and central processing units (CPUs), memory, and input/output (I/O) interfaces within an electronic device, such as a computer, relies on a buck voltage regulator. The voltage regulator provides different voltages and different amounts of available current to different components of the electronic device.

Figure 1A:
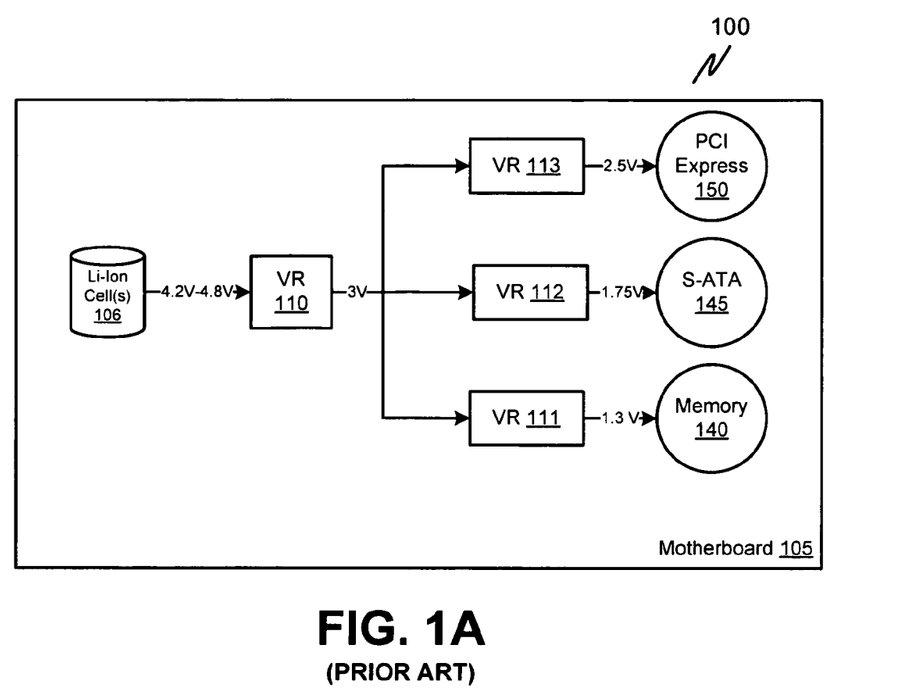
FIG. 1A is a block diagram schematically illustrating a conventionally implemented power delivery network.

As electronic devices trend toward power reduction and simultaneous integration of more features, the power delivery network must provide power at a number of different voltage levels for different components. For example, as depicted in FIG. 1A, a mobile computing device 100 includes a motherboard 105 which supports a chipset requiring at least three different regulated voltage rails. This is achieved in stages. In the first stage, a voltage regulator (VR) 110 regulates a power supply, such as i-ion cell(s) 106 to a first voltage level of 3V. Any other power supply may be used in place of the Li-ion battery including rectifying power supply connected to alternating current (AC) mains power supply to produce a 12V or less output voltage. This output voltage is used as input to VR 110.

The VR 110 accommodates a range of voltages that Li-ion battery or mains voltage may output throughout various levels of discharge (e.g. 4.2V-4.8V/cell). As further shown, point of load (POL) voltage regulators coupled with the VR 110 receive the 3V supply as input and provide a second stage of power delivery for each of any number of output load circuits on the motherboard 105. In the example of FIG. 1A, the memory VR 111 provides a 1.3V rail to memory 140, the disk drive VR 112 provides a 1.75V rail to a Serial Advanced Technology Attachment (SATA/100, SATA/300, SATA/600 etc.) compliant interface 145, and the peripheral bus VR 113 provides 2.3V to a PCI Express chip set (PCIe v1.1, PCIe 2.0, etc.) 150.

The three voltages mentioned above are provided only as examples, and a typical computer system may have additional loads that require additional voltages. With additional POL voltage regulators potentially required for a Universal Serial Bus (USB 1.1, 2.0, 3.0, etc.), legacy I/O, wireless interfaces, a CPU, etc., the area of motherboard 105 consumed by voltage regulators in some cases may approach 40%.

A common buck voltage regulator usually has low efficiency at light loads and only performs well at high load. In ultra-mobile computing platforms and in energy-saving fixed platforms, loads are being reduced, and buck-type regulators may frequently operate well below maximum efficiency. Switched capacitor dividers are therefore proposed as a replacement for or supplement to buck converters, linear regulators and other types of voltage regulators.

Switched capacitor circuits use power switches and capacitors to regulate power. Initially at startup, the capacitors have no charge, but must be charged when the circuit is powered on in order to operate. During startup, a large rush of current into the uncharged capacitors can damage both the power switches and the capacitors. If startup is uncontrolled, over-voltages larger the typical component specifications can easily occur.

The over-voltages can be reduced by adequately matching the components in the circuit. If the capacitors are exactly equal, then the charge and the voltage increases will distribute equally. However, a sufficiently accurate match is expensive to achieve in mass produced components. In addition, matching the capacitors does not help gate drive schemes that use the internal capacitor voltages.

BRIEF DESCRIPTION OF THE DRAWINGS

Embodiments of the present invention are illustrated by way of example, and not limitation, in the figures of the accompanying drawings in which like reference numbers are used to refer to like features, and in which.

DETAILED DESCRIPTION

A startup circuit specifically for charging capacitors of a switched capacitor circuit may be used during startup. If it is disabled during normal operation, efficiency is not negatively impacted. Such a circuit may provide increased reliability for the circuit by preventing over voltages during the startup of any connected switched capacitor networks. It also enables a simple, efficient, inexpensive gate drive scheme.

Switched capacitor circuits use power switches and capacitors to regulate power. Initially, the capacitors have no charge, but must be charged when the circuit is powered on in order to operate. During startup, a large rush of current into the uncharged capacitors can damage both the switches and the capacitors. If startup is uncontrolled, over-voltages larger than the typical component specifications can easily occur.

For some switched capacitor circuit designs, the voltages across some of the capacitors in the network are used to drive the transistor switches. The capacitor voltages are much lower than the supply voltages and therefore the overall power consumed by the switches is reduced, reducing overall power consumption and reducing stress on the switches. However, if these capacitors are initially uncharged, then the circuit will not start up. If the circuit does not start up properly, the current draw from an applied load will cause some of the capacitors to overcharge and damage the converter.

By providing a specific startup circuit for a switched capacitor network, current flow is controlled and so is sequencing. By sequencing the current flow, the large inrush current can be avoided. The large inrush current can cause large voltage spikes across the capacitors and the switches, potentially damaging these components.

Figure 1B:
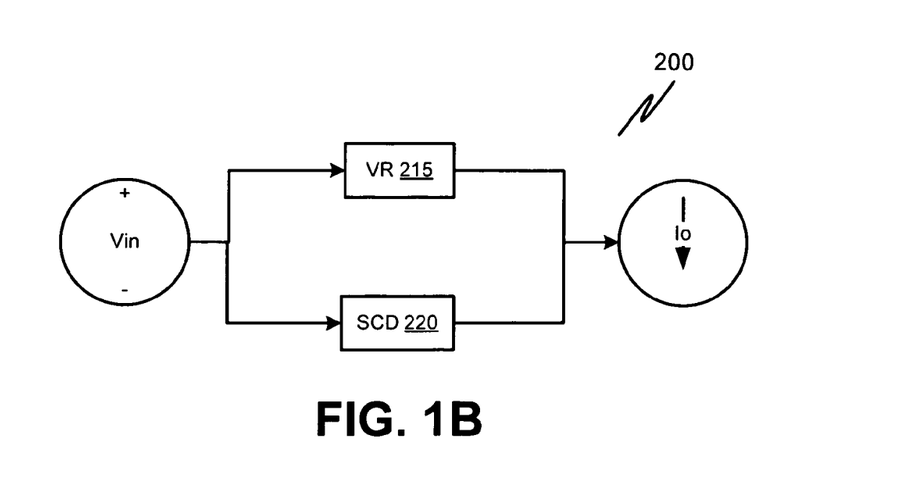
FIG. 1B is a block diagram of a parallel hybrid power delivery network employing a switched capacitor divider in parallel with a current regulator.

As shown in FIG. 1B, a switched capacitor divider (SCD) 220 may be used in parallel with a second type of converter as a current source. As shown, a power delivery network 200 includes a switched capacitor divider (SCD) 220 configured in parallel with a voltage regulator (VR) 215. Such switched capacitor divider embodiments have the advantage of providing multiple ground referenced DC voltages (N−1 DC voltage outputs in a divide-by-N circuit). However, other switched capacitor converter circuits which may not produce such a plurality of voltages may also be used in other embodiments. Both the SCD 220 and the VR 215 are coupled with the voltage input $V_{in}$, such as a battery cell or power supply, and both the SCD 220 and VR 215 are coupled to a common output circuit having a load current $I_o$.

The SCD 220 may be operated at high efficiency when under light loads and the VR 215 is a regulator which may be configured to operate as a current source that has high efficiency at heavy loads. The VR 215 may be used to direct the load current away from the SCD 220 at heavy loads so that the SCD 220 is used predominantly at light loads while the VR 215 is used predominantly at heavy loads. Control of the proportion of load current $I_o$ provided by the VR 215 may thereby maintain a maximum efficiency not otherwise possible from either the SCD 220 or the VR 215 alone.

Generally, the VR 215 may be any type of voltage converter or regulator configurable to operate in a current mode. In that sense, the VR 215 may be conceptualized also as a current regulator, in which case the SCD 220 is a voltage converter configured in parallel with a current regulator. In either respect, VR 215 may be, but is not limited to, a buck converter or a linear regulator. While both linear regulators and buck converters may be configured for use as current sources, linear regulators typically will have a lower efficiency than buck converters at heavy loads. The particular choice may be made based on the particular needs of the corresponding system. In addition, an SCD may be used alone or in a different context.

In the example of FIG. 1B, the SCD 220, as a switched capacitor network, is generally operated as a charge pump or DC transformer and may be employed for conversion of DC voltages. Particular switched capacitor network topologies suitable for IC power delivery are described in U.S. patent application Ser. No. 11/694,391, filed Mar. 30, 2007, commonly owned. As disclosed therein, such switched capacitor networks are readily scaleable to provide multiple power rails and outputs, as required, for powering any number of IC's at a variety of operating voltages.

Figure 1C:
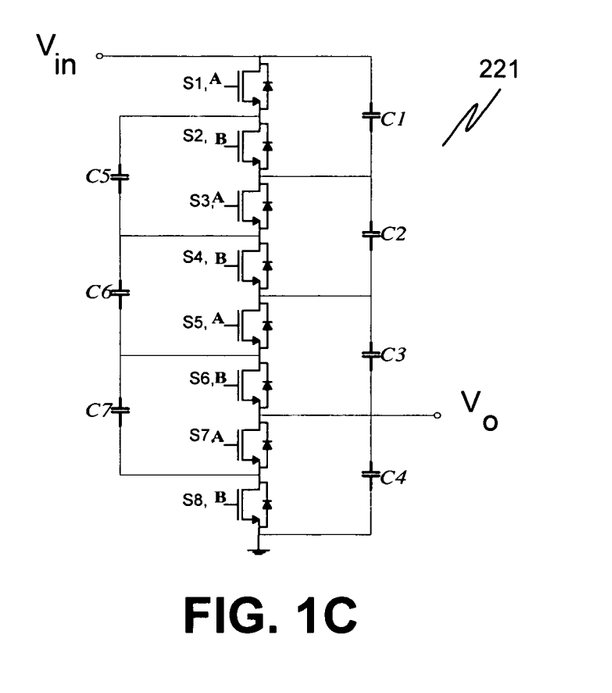
FIG. 1C is a diagram schematically illustrating a divide-by-four switched capacitor divider, in accordance with one embodiment.

In one particular example, the SCD 220 is a divide-by-four switched capacitor divider (divide-by-4 SCD) 221 as depicted in FIG. 1C. Other switched capacitor dividers, such as divide by 2 or 3, may be used instead, depending on the particular implementation. Such switched capacitor divider embodiments have the advantage of providing multiple ground referenced DC voltage levels (N−1 DC voltage outputs in a divide-by-N circuit), but other switched capacitor circuits that may not produce such a plurality of voltages may also be used In FIG. 1C, the divide-by-4 SCD 221 includes eight series connected switches SW1-SW8, alternating between A and B types and coupled as four adjacent A/B switch pairs. The switches may be implemented with insulated gate FETs (IGFETs), vertical MOS (VMOS), lateral diffused MOS (LDMOS) or other commonly known power transistor technologies. However, in a preferred embodiment, the series switches in the divide-by-4 SCD 221 are implemented with CMOS transistors of the type typically employed for low voltage (e.g. 1.5 V) logic applications.

Each switch includes a reverse recovery diode coupled between its source and drain. The diodes are biased toward the drain to linearly regulate each switch.

In the divide-by-4 SCD 221, capacitors C1 through C7 are coupled across the input voltage $V_{in}$ and across the series switches SW1-SW8 to divide $V_{in}$ by parts. Capacitors C1, C2, C3 and C4 each span adjacent A/B switch pairs of the plurality of series switches while capacitors C5, C6 and C7 each span adjacent B/A switch pairs of the plurality of series switches.

In other words, for the eight switches, numbered S1 to S8 from high ($V_{in}$) to low (ground), C1 is coupled at high and between S2 and S3. C2 is coupled across a node between S2 and S3 and a node between S4 and S5. C3 is coupled across the node between S4 and S5 and a node between S6 and S7. C4 is coupled across the node between S6 and S7 and low. The balancing capacitors starting with C5 are coupled across the other nodes. C5 is couple across a node between S1 and S2 and a node between S3 and S4. C6 is coupled across the node between S3 and S4 and a node between S5 and S6. C7 is coupled across the node between S5 and S6 and a node between S7 and S8.

In the particular embodiment depicted, capacitor C4 is in parallel with one of the four adjacent pairs of A/B series switches to provide a voltage division that is one-fourth of the Vin (Vo=¼Vin) for the divide-by-four switched capacitor divider (SCD) 221. Because the voltage levels within the switched capacitor stage is at a fraction of the input voltage, the efficiency of the second stage may be considerably improved.

The capacitors C1-C7 may be implemented in a variety of forms, such as, but not limited to, discrete capacitors, metal-insulator-metal (MIM) capacitors, and MOS capacitors, depending on the current demands of a particular application.

The capacitance values of capacitors C1-C7 depend upon the current demands on the power delivery network. The capacitance values for C1 through C7 may be all equal and in certain embodiments, the capacitance value for each capacitor is between 10 micro Farads (uF) and 100 uF.

Alternating ones of the series FET switches (e.g. switches A) are all coupled together at their gate pins and, during operation are coupled to a "high" signal for time ($DT_s$) while alternating ones of the series FET switches (e.g. switches B) are coupled with an out of phase signal. In other words the A switches are initially coupled with a "high" digital signal during the time period DTs while the B switches are coupled with a low signal. During the following time period (1−D)Ts the A switches are coupled on a low signal, whereas the B switches are coupled on a high signal. Ts is the total switching cycle (e.g. 100 μs) and D is a duty cycle representing the ratio of the regulated output to input voltage and is typically 50% or less.

As such, during a first time interval of the switching cycle, $DT_s$, the A switches are "on" (driven by a digital high signal) while the B switches are "off" (driven by a digital low signal). During the remaining time interval of the switching cycle $(1-D)T_s$, the B switches are "on" (driven by a digital high signal) while the A switches are "off" (driven by a digital low signal). Thus, while both A and B are driven "on" during some portion of the switching cycle, A and B are not driven "on" simultaneously during the overall switching cycle lasting Ts. Similarly, A and B are not "off" simultaneously during the overall switching cycle lasting Ts.

In the particular embodiment depicted, capacitor C4 is in parallel with the one of the four adjacent pairs of AB series switches closest to ground. Accordingly, there is a node between the bottom two capacitors C3, C4 that provides a voltage division that is one-fourth of the input power supply voltage, $V_{in}$ ($V_o=\frac{1}{4}V_{in}$), where $V_{in}$ is the voltage across the input and ground. Nodes between the other capacitors C1, C2, and C3 similarly provide outputs at $V_{in}$, $\frac{3}{4}V_{in}$, and $\frac{1}{2}V_{in}$. These nodes are not used in the example of FIG. 1C, but may be used to supply additional voltage levels for a different implementation. Capacitors C5, C6, and C7 are balancing capacitors as described below.

Considering the switch bridges again, the SCD 221 of FIG. 1C has an example bridge circuit with four series connected transistor switch pairs for a top, bottom and two intermediate switch paths. As shown, a first pair of switches is in series for a top switch path and a fourth pair of switches 820 is in series for a bottom switch path. The first pair of switches is in series with the second pair of switches through the two intermediate pairs of switches with an input voltage $V_{in}$ across the four pairs of switches. $V_O$ is the output bridge voltage coupled at a node between the bottom pair of switches and the adjacent intermediate pair of switches.

Gate signals A, B carry the logic levels that provide the relative duty cycle for the bridge circuit with the A gate signals applied to the upper switch of each pair and the B gate signals applied to the lower switch of each pair. In this application, the A switches are in opposite phase from the B switches with the A gate signal high for a duration of $DT_s$ and a B gate signal high for a duration of $(1-D)T_s$.

Each switch in the circuit has a characteristic parasitic output capacitance. The input voltage will divide across these capacitances when the respective switch is turned off. With each switch of an individual switch pair operated in unison, the capacitance value of adjacent switch pairs determines the voltage division. If these capacitance values are equal, then the input voltage will divide equally. However, equal capacitance is unlikely because semiconductor switches have parasitic capacitances that vary nonlinearly with applied voltage and a certain amount of mismatch between the series connected switches (e.g. MOSFET channel width and length, threshold voltage, drain-source capacitance, transconductance, etc.) can be expected.

Because any imbalance in voltage division can preclude the use of low voltage switches by reducing the voltage margin of a series switch design, a balancing capacitor, (e.g. C5, C6, and C7) is connected at each of the intermediate switch points. That is the balancing capacitors are connected between the pairs of switches at the points that are intermediate the output capacitors. These points are the points between the two switches of each pair. During operation, when a switch path is turned on, the balancing capacitor appears in parallel with a parasitic output capacitance of one switch of a pair of the series switches.

For example, in the bridge circuit as shown in FIG. 1C, when the first two pairs of switches are turned on, the balancing capacitor, C5, appears in parallel with the parasitic capacitances of the two adjacent switches of each of the two pairs. Charge imbalances are thereby reduced as the balancing capacitors switch between the states in the two pairs. By making the capacitance of the balancing capacitances at least two orders of magnitude larger than the parasitic switch capacitances, the effects of the parasitic capacitances are avoided. In one example, the parasitic output capacitances are on the order of about 0.1 or 0.2 nF while the balancing capacitor values are on the order of about 50 nF. Alternatively, if the balancing capacitors have a capacitance value sufficiently large that the voltages across them are nearly direct current (DC) voltages and equal to approximately half the input voltage, the effects are avoided. The particular values to be selected may be adapted to suit any particular application.

A further detail of the series switches of FIG. 1C is that the switches may be selected have lower voltage ratings than the total voltage applied across the bridge ($V_{in}$). This may be done because of the additional voltage margin provided by the balancing capacitors. The balancing capacitors, in this way can prevent switch damage.

Figure 2A:
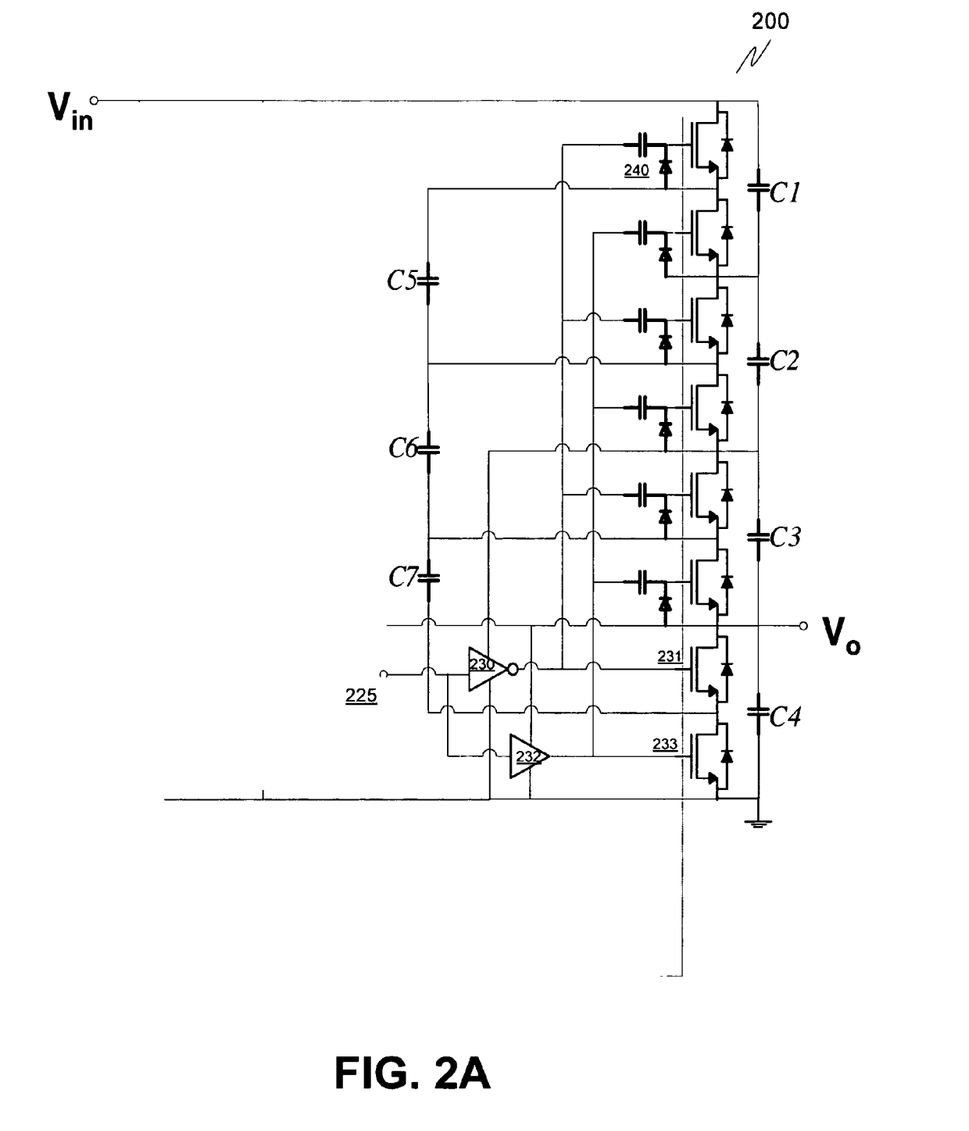
FIG. 2A is a diagram schematically illustrating a divide-by-four switched capacitor divider with a gate drive circuit, in accordance with one embodiment.

FIG. 2A shows an example of the divide-by-four switched capacitor network of FIG. 1C augmented with a gate drive circuit. The illustrated gate drive circuit may be adapted to suit a variety of different switched capacitor networks including those with more or fewer series switches and those with or without balancing capacitors.

In FIG. 2A, a level shifting AC coupler 240 is added to each switch. As with FIG. 1C, the switches may be metal oxide semiconductor field effect transistors (MOSFETs) or any other type of transistor. The linear regulated MOSFETs are coupled in series as in FIG. 1C and the input voltage is divided across the series of linearly controlled MOSFETs. In the illustrated example, the MOSFETs are linearly controlled each with a reverse recovery diode connected between the source and drain of each MOSFET.

The level shifters 240 for each switch each have a capacitor coupled between the gate of the respective switch and the switch's driver output, however, other configurations may be used instead. The gate side of each capacitor is also coupled to a diode of the respective level shifter 240. The diode is coupled to the source of the corresponding switch and biased toward the gate. Each source is coupled to the drain of the next switch in the series or to ground in the case of the last switch in the series.

Through the level shifters, each gate that is not coupled to ground is referenced to ground through the AC coupling. The ground referenced gate drive signals are level shifted through the AC coupling 240 to the gates of the MOSFETs whose drain terminals are not connected to ground.

The drive circuit also has two low side drivers 230, 232. The first driver 230 receives the drive input signal 225, for example a pulse width modulated (PWM) voltage control signal and applies it directly to the A switches of each pair. The second driver 232 receives the same signal, inverts it and applies it to the B switches of each pair. In the illustrated example, only two low side drivers 230, 232 are used to drive all eight switches in the network. However, more may be used depending on the requirements of the particular implementation.

The inverting low-side driver 230 receives its supply voltage from the mid-point of the series capacitor voltage divider network. In the example of FIG. 2A, this voltage is half the power supply input voltage, $V_{in}/2$. The non-inverting low side driver 232, on the other hand receives its supply voltage from the output voltage, $V_O$, which in the example of FIG. 2A is one quarter of the power supply input voltage, $V_{in}/4$.

Figure 2B:
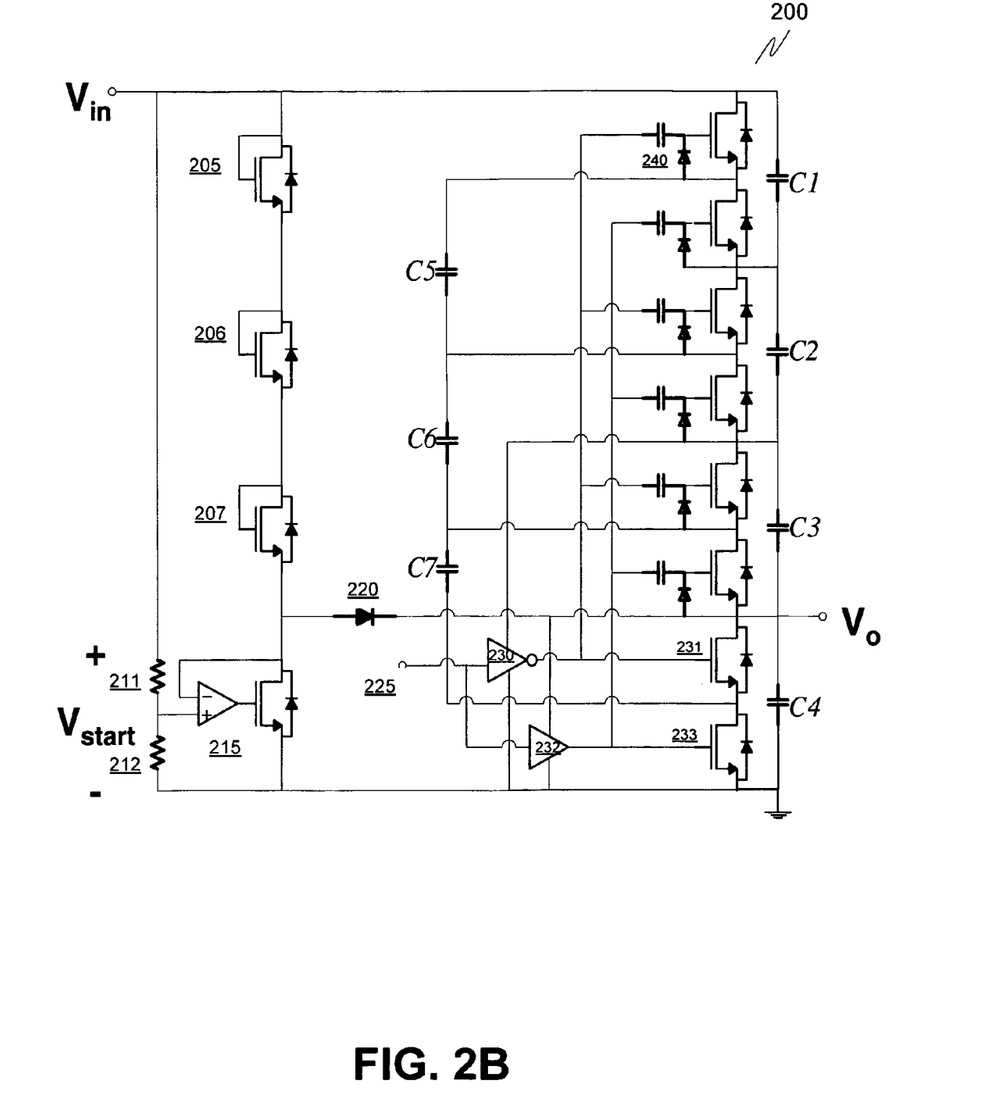
FIG. 2B is a diagram schematically illustrating a divide-by-four switched capacitor divider with a gate drive circuit and a startup circuit, in accordance with one embodiment.

Referring to FIG. 2B, a startup circuit is added to the gate drive circuit and the switched capacitor circuit of FIG. 2A. This startup circuit charges the ac coupling capacitors and also provides controlled charging of the output and balancing capacitors.

The startup circuit includes a series of switches 205, 206, 207, 215 coupled between the drive voltage ($V_{in}$) and ground. Dividing the input across these four devices allows for using lower voltage rated devices than if a single switch were used. In one embodiment, these switches in the startup stack are matched in type and values to the pair of switches in the switched capacitor network. Reasonable matching of these startup devices helps to protect against over-voltage.

Each of the switches is regulated by a feedback loop from its drain to its gate. It also has a diode coupled between its source and drain biased toward its drain. In the case of the last of the four switches in the startup stack, the one closest to ground, an op-amp (operational amplifier) is coupled in the feedback loop between the drain and the gate.

As further shown in FIG. 2B, the op-amp feedback circuit drives the gates of the regulated devices. The op-amp has its output coupled to the gate of the last switch in the startup stack and a first input coupled to the drain of the same switch. The second input is a reference command signal $V_{start}$.

The reference command of the op-amp feedback is set by two resistors 211, 212 that form a voltage divider to divide the input voltage $V_{in}$. The voltage divider allows the reference command to be set at any desired voltage. For this example, the set point ($V_{start}$) may be selected to be some value less than the output of the switched capacitor network $V_O = V_{in}/4$.

A startup diode 220 is coupled to a node between the drain of the bottom switch in the startup stack and the source of the adjacent switch up in the startup stack. The startup diode is coupled at its opposite end to the output voltage $V_O$ of the switched capacitor network forward biased toward the network. As in FIG. 2A, the output voltage is also coupled to voltage supply input of the non-inverting low side driver 232. The diode accordingly provides current to the capacitors of the network and the low side driver as long as the start voltage, $V_{start}$, is greater than the output voltage, $V_O$.

The startup diode may be used to prevent the startup circuit from delivering current to the switched capacitor network during normal operation. To disable the startup circuit, the forward diode is placed in series with the startup circuit current supply to the network. The diode is forward biased whenever the output voltage V0 is less than the startup voltage $V_{start}$. ($V_o < V_{start}$) This occurs during startup and at any other time that the output voltage drops below the startup set point voltage. On the other hand, the startup circuit is disabled when the diode is reverse biased during normal operation. During normal operation the output voltage is typically greater than the startup set point voltage, $V_O > V_{start}$.

To ensure that the startup circuit is disabled during normal operation, the set point can be less than the minimum output voltage plus the forward voltage of the startup diode 220. The minimum output voltage depends on the output resistance of the switched capacitor network and the maximum load current.

Since the startup diode 220 is coupled directly to the output voltage V0, the startup voltage is also applied as the supply voltage to the non-inverting low-side driver 232. The output of this driver will accordingly ramp up with the startup voltage to slowly charge the capacitors at each level shifter. This ramp up will also affect the inverting low side driver 230 through the voltages supplied to the capacitor network.

Figure 2C:
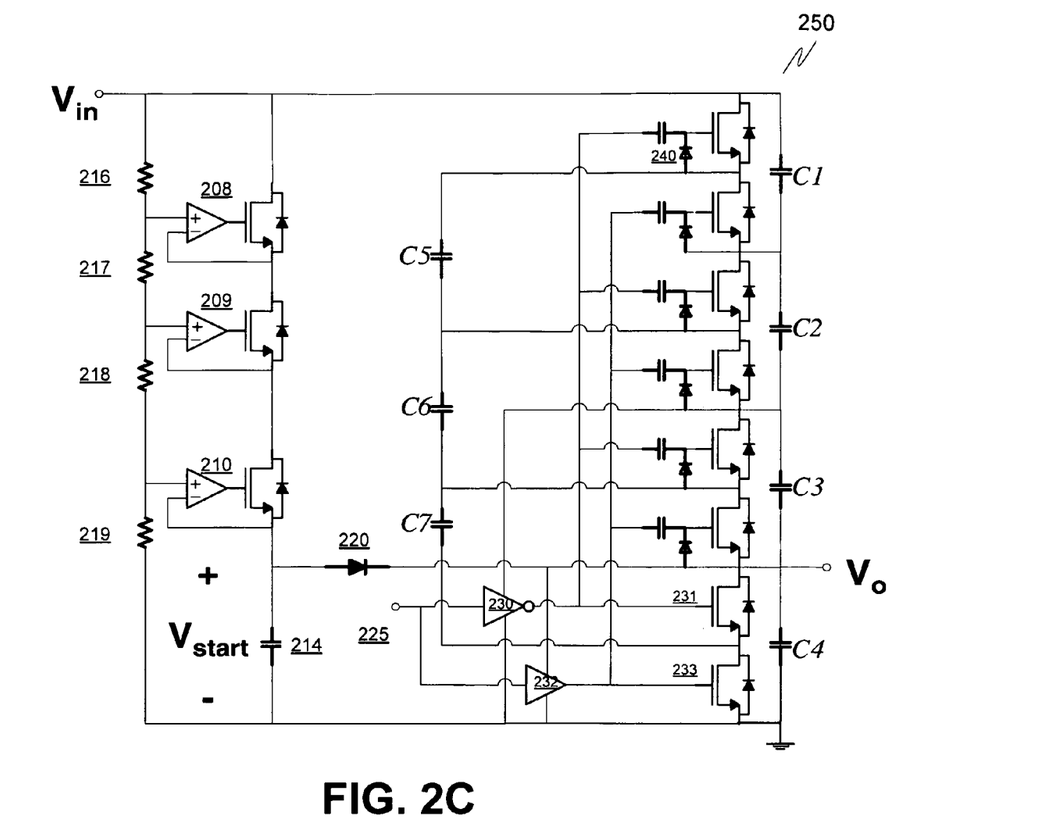
FIG. 2C is a diagram schematically illustrating a divide-by-four switched capacitor divider with a gate drive circuit and an alternative startup circuit with multiple drivers, in accordance with one embodiment.

FIG. 2C shows an alternative startup circuit coupled to the same switched capacitor network through the same startup diode 220. In FIG. 2C, the startup voltage is spread over three separate op-amps 208, 209, 210 rather than relying on a single op-amp 215 to provide all of the startup current. In the example of FIG. 2C, the switched capacitor network is the same as in FIGS. 2A and 2B. The startup circuit applies the startup voltage $V_{start}$ through the same forward biased startup diode 220. However this voltage $V_{start}$ is now the voltage between a startup stack of three regulated MOSFETS and ground instead of the four MOSFET startup stack of FIG. 2B.

The startup stack has three switches 208, 209, 210 coupled in series. As in FIG. 2B, a reverse biased diode is coupled from the source to the drain of each switch as in the startup circuit of FIG. 2B. Each switch is coupled to its own op-amp to drive each respective gate. As with the op-amp of FIG. 2B, the inputs to each op amp are the source of the respective switch and a division of the input voltage, $V_{in}$.

The input voltage is divided by being applied across four resistors 216, 217, 218, and 219 coupled in series to provide three voltage dividers, one for each op-amp input. The resistors are selected in order to set the startup voltage, the voltage between the source of the third MOSFET in the series stack and ground to its desired level, such as some level less than $V_O = V_{in}/4$, as described above. A capacitor 214 between the startup voltage and ground is used in the startup circuit.

Figure 3A:
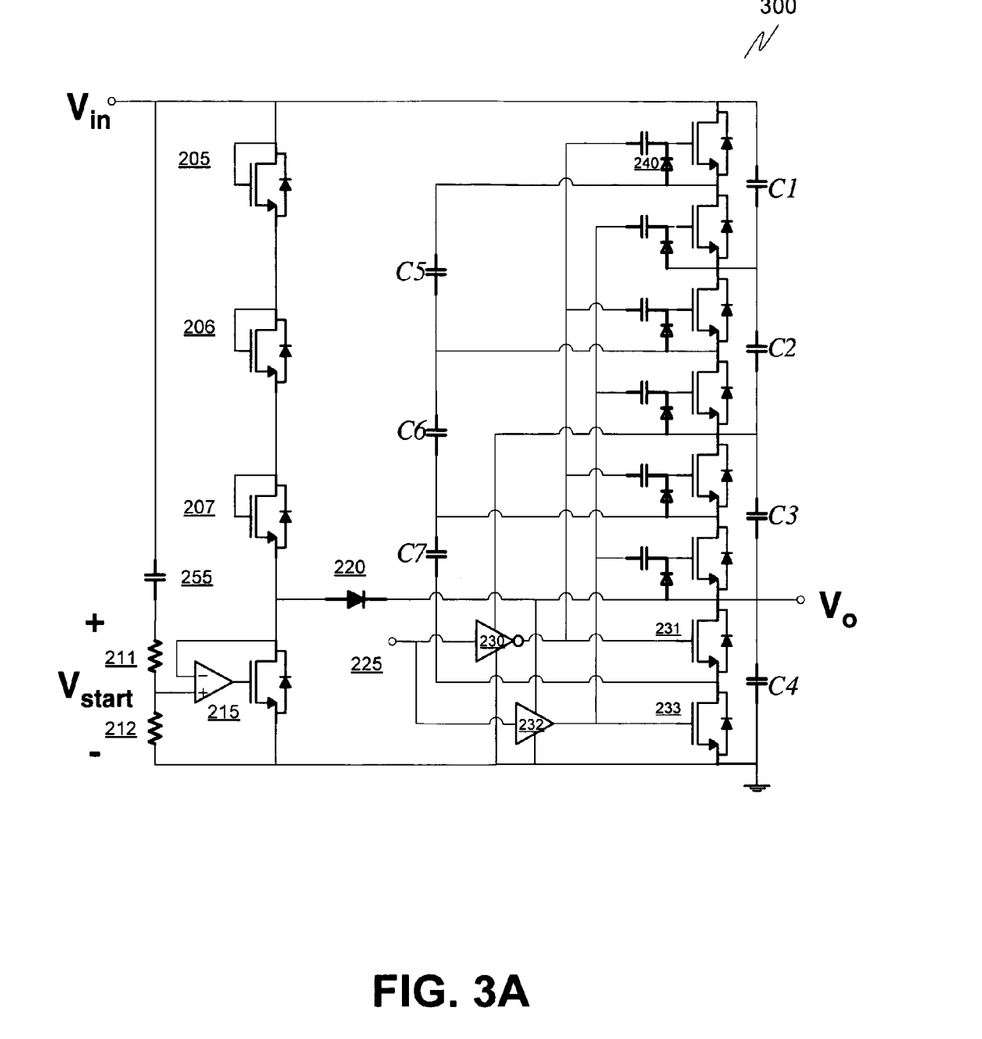
FIG. 3A is a diagram schematically illustrating a divide-by-four switched capacitor divider with a gate drive circuit and a soft start startup circuit, in accordance with one embodiment.

As shown in FIG. 3A, a soft start mechanism may be used in any of the startup circuits described above to ensure that the startup circuit is disabled during normal operation. In the example of FIG. 3A, a capacitor 255 is placed in series with the resistive voltage divider circuit 211, 212 for the set point. The startup capacitor is between the voltage divider and the voltage supply. The starting capacitor 255 is initially uncharged, so the voltage across it starts at zero volts. The resistive voltage divider 211, 212 is set to the nominal switched capacitor output voltage (e.g. $V_{start} < V_{in}/4$).

As the resistive voltage divider 211, 212 draws current from the input source, the starting capacitor 255 charges. In steady state, the starting capacitor will be charged so that the voltage across the capacitor equals the input voltage. The startup set point, as determined by the starting diode 220, slowly decreases as the starting capacitor charges. The starting diode (Dstart) 220 will eventually reverse bias when the switched capacitor network starts maintaining the output voltage. Hence the startup circuit is disabled during normal operation and the initial startup voltage may be set to a wide range of different values. The soft start capacitor also allows for initial fluctuations in the input voltage $V_{in}$ to be absorbed without affecting the start up process.

Figure 3B:
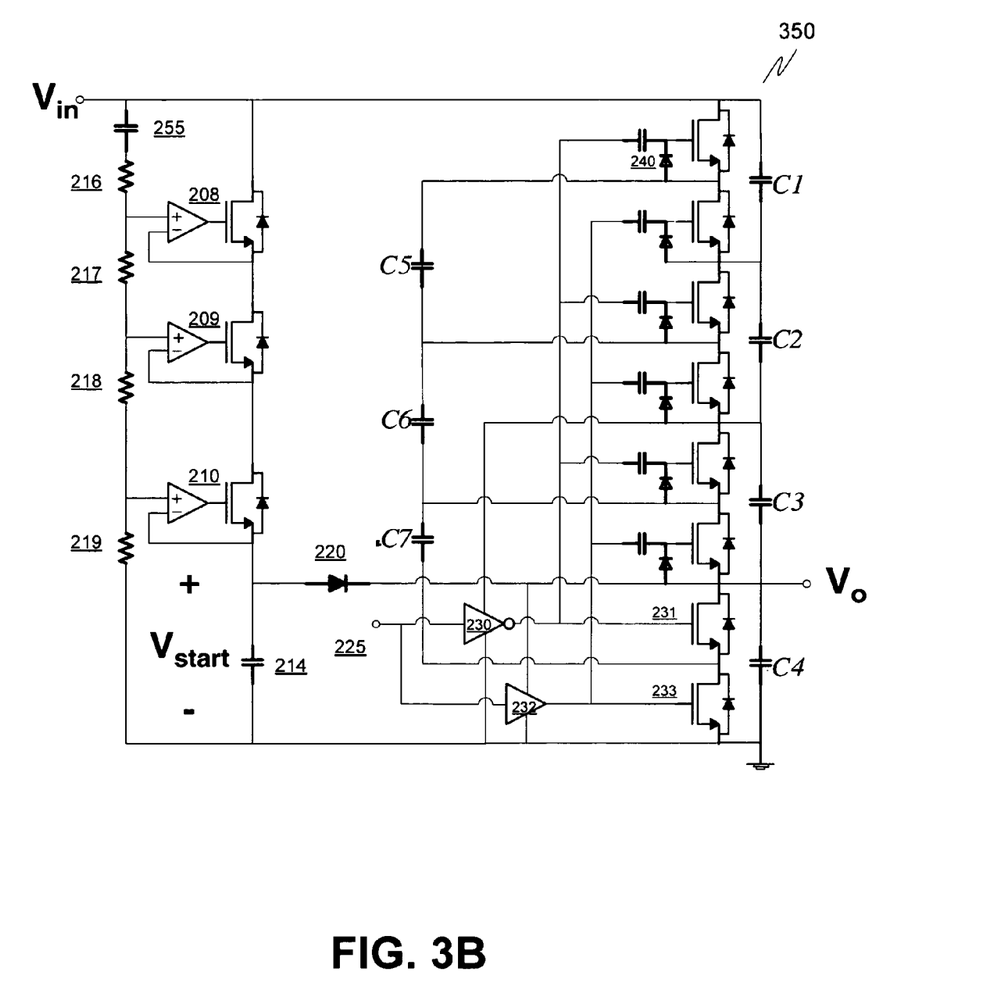
FIG. 3B is a diagram schematically illustrating a divide-by-four switched capacitor divider with a gate drive circuit and a soft startup circuit; with additional drivers, in accordance with one embodiment.

FIG. 3B is similar to FIG. 2C except that, similar to FIG. 3A it includes a soft start capacitor 255 in the startup circuit. As in FIG. 3A, the soft start capacitor is placed between the supply voltage and the voltage divider. The operation of the startup circuit and the soft start feature is similar to that of FIG. 3A.

Figure 4A:
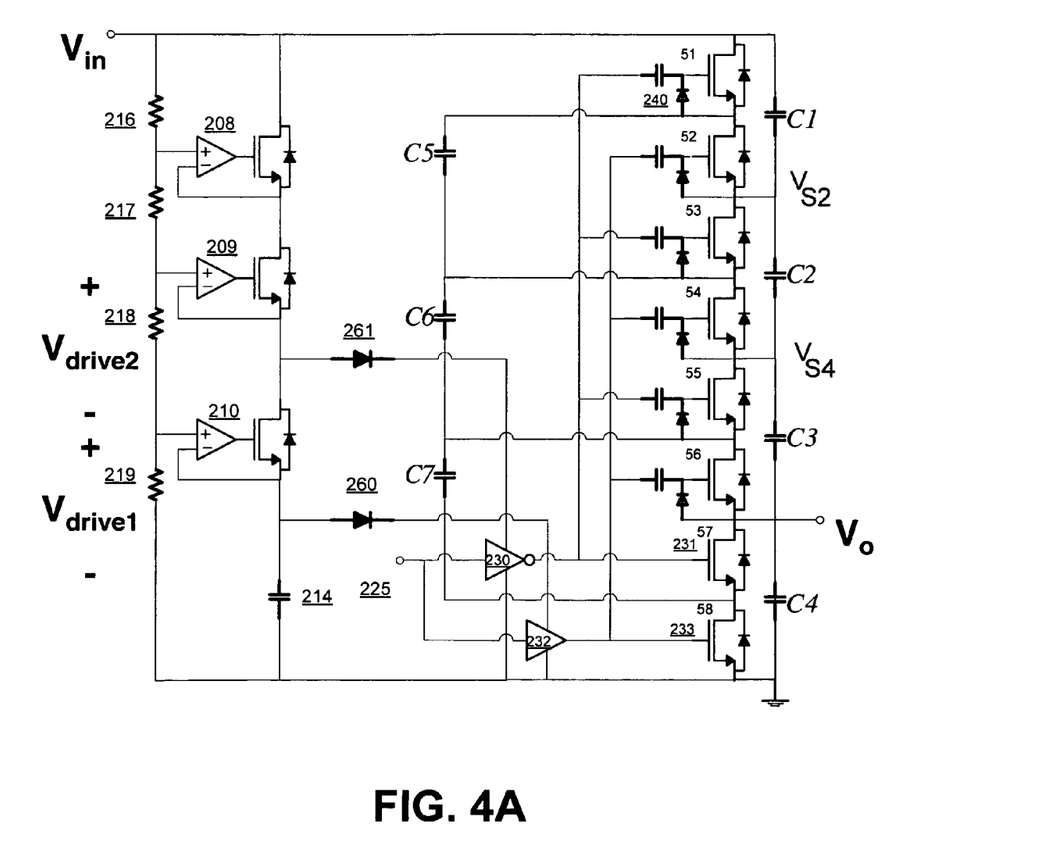
FIG. 4A is a diagram schematically illustrating a divide-by-four switched capacitor divider with a gate drive circuit and a linear driver supply circuit, in accordance with one embodiment.

Referring to FIG. 4A, as a further alternative, a linearly regulated gate drive may be used to drive and power the switched capacitor network instead of the startup circuit and its variations described above. The driver supply circuit is similar to the startup circuit of FIG. 3B, including a soft start capacitor 214 between the start voltage $V_{start}$ and ground. However, in the example of FIG. 4A, a second of the three op-amp feedback voltage regulated MOSFETs 209 in the startup stack is tapped to provide a second drive voltage.

The first drive voltage, $V_{drive1}$, is provided from the bottom gate drive 210 through a forward biased diode 260 as the supply voltage to the non-inverting low-side driver 232. The second drive voltage, $V_{drive2}$, is provided from the middle gate drive 209 through a forward biased diode 261 to the inverting low side driver 231. This provides a direct driver for both of the linearly regulated switches 210 of each pair of switches in the switched capacitor network. It is further shown in FIG. 4A that the first drive voltage is not coupled to the output voltage, $V_O$, of the switched capacitor network. The gate drives operate, accordingly, as gate drivers and not as a charging startup circuit for the system.

The two linear regulators provide the driving voltage for the switched capacitor devices. This provides a stable driver supply, but is less efficient than the simpler single gate drive approach shown, for example in FIGS. 2A and 3A. The double linear regulator circuit may also be used as a startup circuit as shown in FIG. 4B.

Figure 4B:
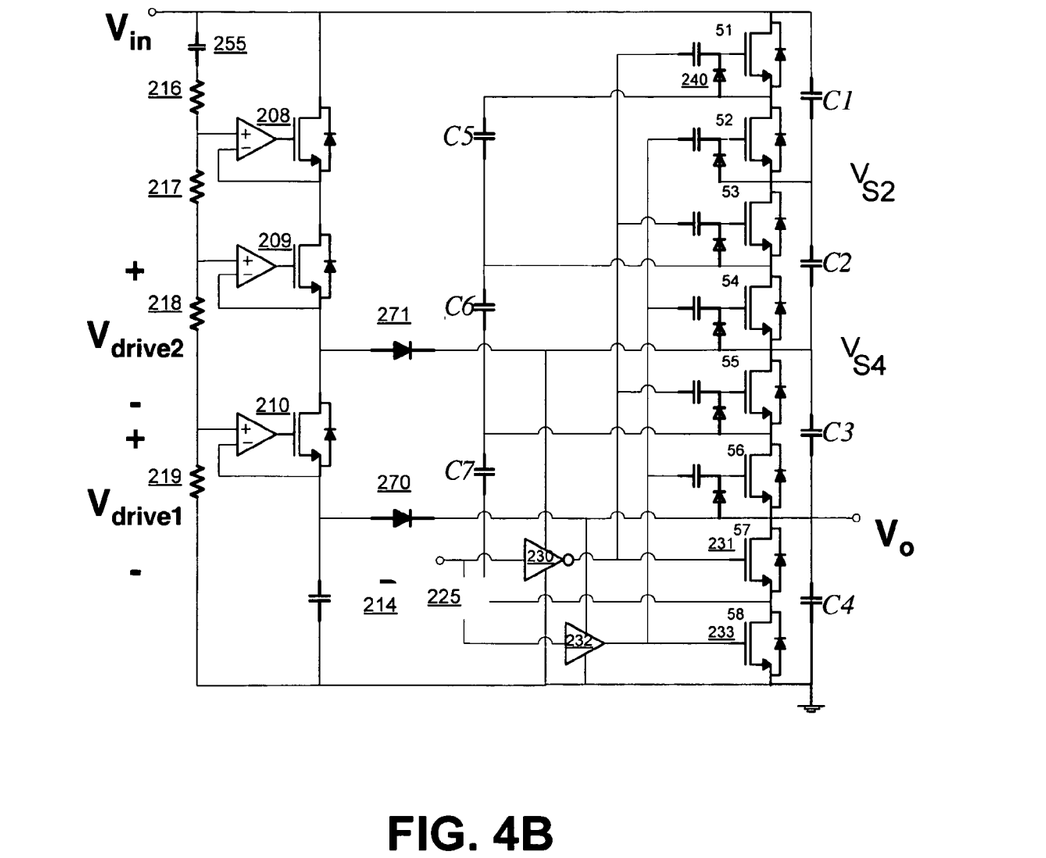
FIG. 4B is a diagram schematically illustrating a divide-by-four switched capacitor divider with a gate drive circuit and a linear driver supply circuit that also functions as a soft start circuit, in accordance with one embodiment.

In FIG. 4B, the first drive voltage is coupled also to the output voltage, $V_O$, node so that it operates as a first startup voltage, $V_{start1}$, as well as a gate driver. The second drive voltage is similarly coupled to also to the intermediate voltage node of the capacitor stack as a second startup voltage, $V_{start2}$. The system of FIG. 4B is otherwise the same as that of FIG. 4A.

Figure 5A:
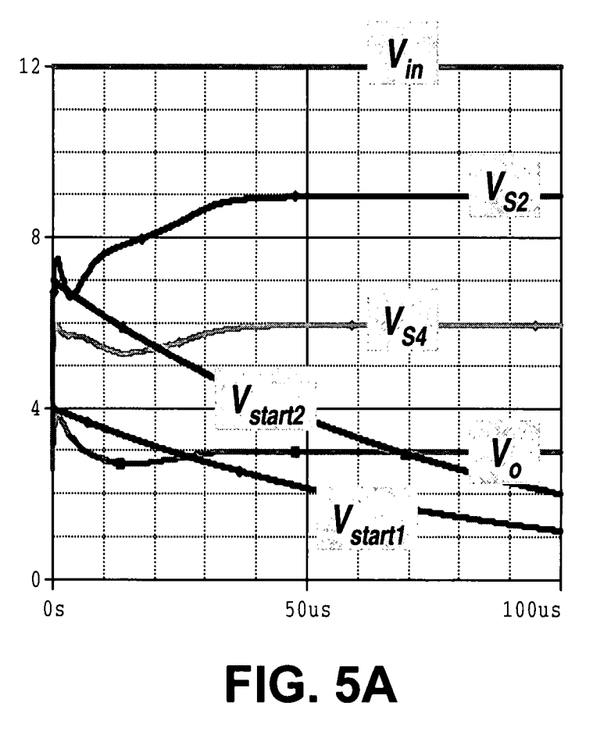
FIG. 5A is a graph depicting a simulation of the circuit topology depicted in FIG. 4B, in accordance with one embodiment.
Figure 5B:
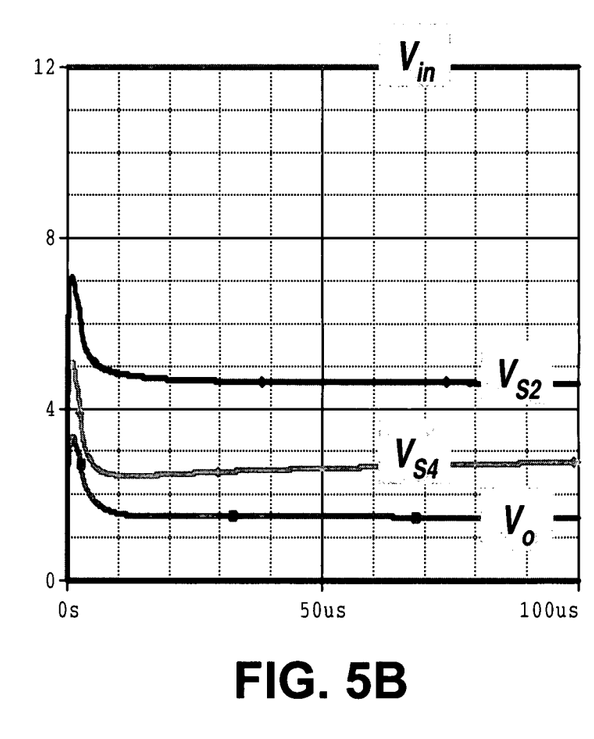
FIG. 5B is a graph depicting a simulation of the circuit topology depicted in FIG. 4A without the startup circuit, in accordance with one embodiment.

FIGS. 5A and 5B show simulation data for the circuits of FIGS. 4B and 4A, respectively. Based on these simulations, the switched capacitor circuit of FIG. 4A fails to startup without the startup circuit shown in FIG. 4B. In both cases, in FIGS. 5A and 5B, the input voltage $V_{in}$ is constant. The two diagrams show the various voltages at different nodes on the vertical axis against time on the horizontal axis measured from the start time.

Referring to FIG. 5A, $V_{S2}$ is the node between C1 and C2, which is at the same time the source of switch S2. $V_{S4}$ is the node between C2 and C3 and is at the same time the source pin of switch S4. $V_{start1}$ and $V_{start2}$ correspond to $V_{drive1}$ and $V_{drive2}$ in FIGS. 4A and 4B. The soft start mechanism was used in the simulation of FIG. 5A, which is evident by the decreasing $V_{start1}$ and $V_{start2}$.

With well balanced output capacitance, the ground-referenced voltage at nodes Vo, $V_{S4}$ and S4 are expected to be Vin/4, 2*Vin/4 and 3*Vin/4. For the 12V example of FIGS. 5A and 5B, this corresponds to 3V, 6V, and 9V, respectively. In the case of FIG. 5B, where no startup circuit is used, it can be seen that none of the voltage levels is reached after 100 µs. $V_{S2}$ reaches almost 5V, not 9V. $V_{S4}$ reaches almost 3V, not 6V.

In the case of the FIG. 5A, where the proposed startup circuit is used, it can be seen that the expected voltage levels of 3V, 6V and 9V are reached within 50 µs based on a 12V input voltage. The start up voltages start high and then slowly taper off as the main drive voltages begin to dominate.

Thus, drive circuits and a startup circuits for switched capacitor networks are described. These may be used for power delivery to an IC or other purposes and are well adapted to be built using semiconductor processing technologies. The drive circuits may be used independently of the startup circuits and vice versa although they are well suited for use together. Although embodiments of the present invention has been described in language specific to structural features or methodological operations, the invention defined in the appended claims is not necessarily limited to the specific features or operations described. The specific features and operations disclosed are used to illustrate rather than limit the present invention.

Particular embodiments may be practiced without one or more of the specific details described, or in combination with other known methods, materials, and apparatuses. In the description, numerous specific details are set forth, such as specific materials, dimensions and material parameters etc. to provide a thorough understanding of the present invention. In other instances, well-known design and fabrication techniques have not been described in particular detail to avoid unnecessarily obscuring the present invention.

Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments. For example, a first embodiment may be combined with a second embodiment anywhere the two embodiments are not mutually exclusive.

What is claimed is:

1. An apparatus comprising:
   a switched capacitor drive circuit having a switch network including a plurality of switches connected in series across a voltage and a capacitor network including a plurality of capacitors connected in series across the voltage to divide the voltage into a plurality of different voltage outputs, each capacitor of the plurality of capacitors being coupled across a source and a drain of two series-connected switches of the plurality of switches, a first of the two switches of each of the two series-connected switches constituting a top switch path and the second of the two switches of each of the two series-connected switches constituting a bottom switch path;
   a plurality of level shifters each coupled to a gate of each switch of the switched capacitor drive circuit to couple alternating current into the respective gate;
   a positive phase, non-inverted low side driver coupled to each level shifter to drive the gates of the top switch path through the respective level shifters; and
   a negative phase, inverted low side driver coupled to each level shifter to drive gates of the bottom switch path through the respective level shifters.

2. The apparatus of claim 1, wherein the level shifter comprises a capacitor coupled between each gate and the positive and negative phase low-side driver, respectively.

3. The apparatus of claim 2, wherein the level shifter comprises a diode between a source and a drain of each switch.

4. The apparatus of claim 1, wherein at least one of the positive phase and the negative phase low side drivers has a pulse width modulated input to activate corresponding switches with a duty cycle according to the input.

5. The apparatus of claim 1, wherein at least one of the positive phase and the negative phase low side drivers has a power supply input coupled to a voltage source node of the switched capacitor drive circuit.

6. The apparatus of claim 1, wherein at least one of the positive phase and the negative phase low side drivers has a power supply input coupled to a linear regulated voltage supply.

7. The apparatus of claim 6, wherein the linear regulated voltage supply comprises a switch regulated by an amplifier feedback circuit.

8. The apparatus of claim 6, wherein the linear regulated voltage supply is also coupled to an output voltage node of the switched capacitor drive circuit.

9. The apparatus of claim 6, wherein the linear regulated voltage supply is a component of a start up circuit for applying a starting current to the switched capacitor drive circuit.

10. The apparatus of claim 9, wherein the start up circuit comprises a capacitive soft start circuit, to slow the application of the starting current.

11. The apparatus of claim 9, wherein the start up circuit comprises a switch to disconnect the starting current when the output voltage of the switched capacitor drive circuit reaches a predefined level.

12. The apparatus of claim 1, wherein the switched capacitor drive circuit comprises:
   the switch network comprising a plurality of pairs of FETs (Field Effect Transistors), the FETs being configured with source terminals coupled with drain terminals to be in series across a voltage input;
   the capacitor network including a plurality of capacitors connected across the voltage input and across the switch network to divide the input voltage into a plurality of first voltage outputs; and
   a plurality of linear regulators, each linear regulator coupled with one of the plurality of first voltage outputs to regulate a second voltage output.

13. The apparatus of claim 12, wherein a first capacitor of the plurality of capacitors is coupled to a first source terminal of a first and second pair of FETs and a second capacitor of the plurality of capacitors is coupled to a second source terminal of the first and second pair of FETs, the first and second capacitors to be charged and discharged when the first FETs of the first and second pairs of FETs are opened and closed out of phase with the second FETs of the first and second pairs of FETs.

14. The apparatus of claim 13, wherein a balancing capacitor is coupled with a node between the switches of the first pair of FETs and coupled with a node between the switches of the second pair of FETs, the switched capacitor drive circuit further comprising a voltage output coupled with a node between the first pair of switches and the second pair of switches, the voltage output to be coupled with an IC to be powered.

15. A power supply for an integrated circuit comprising:
   an input to receive system power;
   a linear regulated voltage supply to receive the system power and supply a regulated voltage;
   a switched capacitor drive circuit having a switch network including a plurality of switches connected in series across a voltage and a capacitor network including a plurality of capacitors connected in series across the voltage to divide the voltage into a plurality of different voltage outputs, each capacitor of the plurality of capacitors being coupled across a source and a drain of two series-connected switches of the plurality of switches, a first of the two switches of each of the two series-connected switches constituting a top switch path and the second of the two switches of each of the two series-connected switches constituting a bottom switch path;
   a plurality of level shifters each coupled to a gate of each switch of the switched capacitor drive circuit to couple alternating current into the respective gate;
   a positive phase, non-inverted low side driver coupled to each level shifter to receive the regulated voltage from the linear regulated voltage supply and drive the gates of the top switch path through the respective level shifters;
   a negative phase, inverted low side driver coupled to each level shifter to receive the regulated voltage from the linear regulated voltage supply and drive gates of the bottom switch path through the respective level shifters;
   a pulse width modulated input coupled to the positive and negative phase low side drivers to activate corresponding switches with a duty cycle according to the input; and
   a plurality of voltage output nodes coupled to the switched capacitor circuit to provide the plurality of different voltage outputs at each output node.

16. The power supply of claim 15, further comprising a start up circuit for applying a starting current to the switched capacitor drive circuit, the start up circuit including a switch to disconnect the starting current when the output voltage of the switched capacitor drive circuit reaches a predefined level.

17. The power supply of claim 15, wherein the switched capacitor drive circuit comprises:
   the switch network comprising a plurality of pairs of FETs (Field Effect Transistors), the FETs being configured with source terminals coupled with drain terminals to be in series across a voltage input;
   the capacitor network including a plurality of capacitors connected across the voltage input and across the switch network to divide the input voltage into a plurality of first voltage outputs; and
   a plurality of linear regulators, each linear regulator coupled with one of the plurality of first voltage outputs to regulate a second voltage output.

18. A method comprising:
   driving the gates of a top switch path of a switched capacitor drive circuit with an alternating current through respective level shifters using a positive phase, non-inverted low side driver coupled to each respective level shifter; and
   driving the gates of a bottom switch path of a switched capacitor drive circuit with an alternating current through respective level shifters using a negative phase, inverted low side driver coupled to each respective level shifter,
   wherein the switched capacitor drive circuit comprises a plurality of capacitors connected in series across a voltage to divide the voltage into a plurality of different voltage outputs, the top switch path having switches, each with a source coupled to one side of a respective capacitor of the capacitor network, the bottom switch path having switches, each with a drain coupled to an opposite side of a respective capacitor of the capacitor network, each switch of the top switch path being coupled in series to a respective switch of the bottom switch path.

19. The method of claim 18, further comprising activating the positive phase and the negative phase low side drivers with a duty cycle using a pulse width modulated input.

20. The method of claim 18, further comprising applying a starting current to the switched capacitor drive circuit to slow the application of the starting current and disconnecting the starting current when the output voltage of the switched capacitor drive circuit reaches a predefined level.

* * * * *